United States Patent
Wang

(10) Patent No.: US 7,700,386 B2
(45) Date of Patent: Apr. 20, 2010

(54) PACKAGING METHOD OF LED OF HIGH HEAT-CONDUCTING EFFICIENCY AND STRUCTURE THEREOF

(75) Inventor: Pei-Choa Wang, Gueishan Township, Taoyuan County (TW)

(73) Assignee: Pyroswift Holding Co., Limited, Wanchal (HK)

( * ) Notice: Subject to any disclaimer, the term of this patent is extended or adjusted under 35 U.S.C. 154(b) by 82 days.

(21) Appl. No.: 12/017,316

(22) Filed: Jan. 21, 2008

(65) Prior Publication Data

US 2008/0258157 A1  Oct. 23, 2008

(30) Foreign Application Priority Data

Apr. 23, 2007  (TW) ............... 96114219 A

(51) Int. Cl.
*H01L 21/00* (2006.01)
(52) U.S. Cl. .......................... 438/29; 257/98
(58) Field of Classification Search ............ 438/22, 438/23–29; 257/98–100
See application file for complete search history.

(56) References Cited

U.S. PATENT DOCUMENTS

| 4,935,665 | A * | 6/1990 | Murata | 313/500 |
| 7,494,250 | B2 * | 2/2009 | Chen | 362/294 |
| 2004/0164675 | A1 * | 8/2004 | Wang et al. | 313/512 |
| 2005/0072981 | A1 * | 4/2005 | Suenaga | 257/88 |
| 2007/0236935 | A1 * | 10/2007 | Wang | 362/294 |
| 2008/0001160 | A1 * | 1/2008 | Andrews | 257/79 |

FOREIGN PATENT DOCUMENTS

TW   M292879   6/2006

* cited by examiner

*Primary Examiner*—Steven Loke
*Assistant Examiner*—Kimberly M Thomas
(74) *Attorney, Agent, or Firm*—Chun-Ming Shih

(57) ABSTRACT

A packaging method of LED of high heat-conducting efficiency and a structure thereof firstly is to provide a copper substrate having a plurality of indentations. An insulating layer is formed on the surface of the substrate and the bottom of the indentations. Meanwhile, a set of metallic circuits is formed on the insulating layer of the substrate, and a layer of insulating lacquer is coated on the surface of the metallic circuits, where there is no electric connection and no enclosure. A tin layer is coated on the insulating layer of the indentation and the metallic circuits, where there is no insulating lacquer. Furthermore, a set of light-emitting chips are die bonded on the tin layer of the indentation. Next, the light-emitting chips and the metallic circuits are electrically connected by a set of gold wires. Moreover, a ringed object is arranged on the surface of the substrate, such that the light-emitting chip set, the gold wires and the metallic circuits are enclosed therein. Meanwhile, a fluorescent glue is attached to the light-emitting chip set, the gold wires and the metallic circuits. Eventually, an epoxy resin is filled into the interior of the ringed object to be dry for forming an epoxy resin layer. Thus, a packaging manufacture of LED is completed.

10 Claims, 11 Drawing Sheets

PACKAGING METHOD OF LED OF HIGH HEAT-CONDUCTING EFFICIENCY AND STRUCTURE THEREOF

BACKGROUND OF THE INVENTION

1. Field of the Invention

The present invention generally relates to an LED, in particular, to a packaging method of LED of high heat-conducting efficiency and a structure thereof.

2. Description of Prior Art

Light-emitting diode (LED) is a semiconductor component in solid state, which applies an inter-combination of electron and hole to release energy in a form of light. LED belongs to luminescence lighting and has many merits, such as: small size, long life, low electricity consumption, quick reaction speed, and vibrating endurance. Basically, LED is a light-emitting component for a variety of appliance, information-showing board, and communicating product.

As shown in FIG. 1 and FIG. 2 (i.e. ROC Patent M292879), when a traditional LED is manufactured, a metallic plate 100 is firstly stamped into a lead frame 101, which is placed into a die together with a metallic base 103. After injection formation, two electrode legs 102 of the lead frame 101 and a partial area of the base 103 are enclosed and fixed by the glue seat 104, making base 103 and two electrode legs 102 located in an indentation 105 of the glue seat 104. Next, the light-emitting chip 106 is die-bonded onto the surface of the base 103 by means of silver glue, and the light-emitting chip 106 and two electrode legs 102 are electrically connected by gold wires 107. Finally, after a fluorescent glue body 108 is attached to the light-emitting chip, an epoxy resin 109 is further filled into the indentation 105 of the glue seat 104.

However, the above manufacturing steps of LED are so tedious that they consume too many working time and labor, making it being impossible to lower down the manufacturing cost. According to the prior manufacturing method of LED, a light-emitting chip 106 is firstly pasted onto a base (or lead frame) by means of silver glue, then the positive and negative electrodes of the light-emitting chip 106 are connected to the electrode legs 102 by means of wiring machine with gold or aluminum wire, finally an epoxy resin 109 is applied to complete the packaging procedure. However, since the poor physical characteristics of electrode legs 102, base 103, and epoxy resin 109 in terms of heat conduction, heat resistance reaches as high as 250° C./W~300° C./W in this traditional packaging form. Therefore, the temperature of LED will rise due to the poor heat dissipation, consequently causing the deterioration and ageing of the epoxy resin 109. In a long term, the light-emitting efficiency of the LED will be decreased and the temperature increment will be accelerated, because of the thermal accumulation. A poor reliability phenomenon is caused by a structure stress generated from the temperature increment.

Accordingly, aiming to solve aforementioned shortcomings, after a substantially devoted study, in cooperation with the application of relatively academic principles, the inventor has at last proposed the present invention that is designed reasonably to possess the capability to improve the prior arts significantly.

SUMMARY OF THE INVENTION

The invention is mainly to provide a simple structure and manufacturing method for solving the drawbacks of traditional method in manufacturing LED, thus that its manufacturing cost is lowered down. According to the invention, first of all, a copper metal is provided as a substrate, of which tin thickness applied as die bond is controlled around 4~5µ, aiming to reducing thermal resistance of heat transfer, promoting cooling effectiveness, increasing using life of light-emitting chip, and preventing deterioration of materials.

Secondly, the invention is to provide a packaging method of LED of high cooling efficiency and a structure thereof. First of all, a copper substrate having a plurality of indentations is provided. Then, an insulating layer is formed on the surface of the copper substrate and the bottom of the indentations. Furthermore, a set of metallic circuits is formed on the insulating layer of the copper substrate. Again, a layer of insulating lacquer is coated on the surface of the circuit set, where there is no electric connection and no enclosure. Meanwhile, a tin layer is coated on the insulating layer of the indentation and the surface of the metallic circuit set, where there is no insulating lacquer. Next, the light-emitting chip set is die-bonded on the tin layer of the indentation. Subsequently, the surfaces of the light-emitting chip set and the metallic circuit set are electrically connected by a set of gold wires, making the light-emitting chip set formed an electrical connection in series. Moreover, a hollow ringed object is arranged on the surface of the copper substrate, such that the light-emitting chip set, the gold wires, and circuits are enclosed in the ringed object. Afterwards, a fluorescent glue is attached to the light-emitting chips, the gold wires, and the metallic circuits, such that a fluorescent layer is formed. Finally, an epoxy resin is filled into the interior of the ringed object to enclose the fluorescent layer. After the epoxy resin is dry, an epoxy resin layer is formed. Thus, a packaging manufacture of LED is completed.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE INVENTION

In cooperation with attached drawings, the technical contents and detailed description of the present invention are described thereinafter according to a number of preferable embodiments, being not used to limit its executing scope. Any equivalent variation and modification made according to appended claims is all covered by the claims claimed by the present invention.

Figure 1:
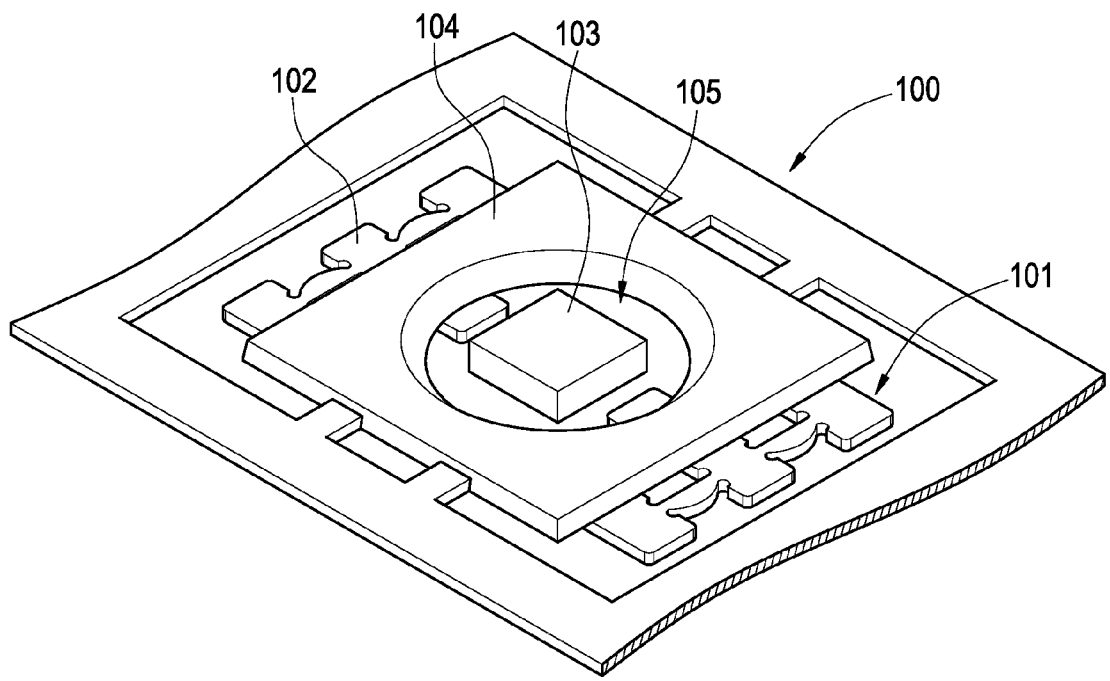
FIG. 1 is an outer appearance illustration of a lead frame and a glue seat of a traditional LED.
Figure 2:
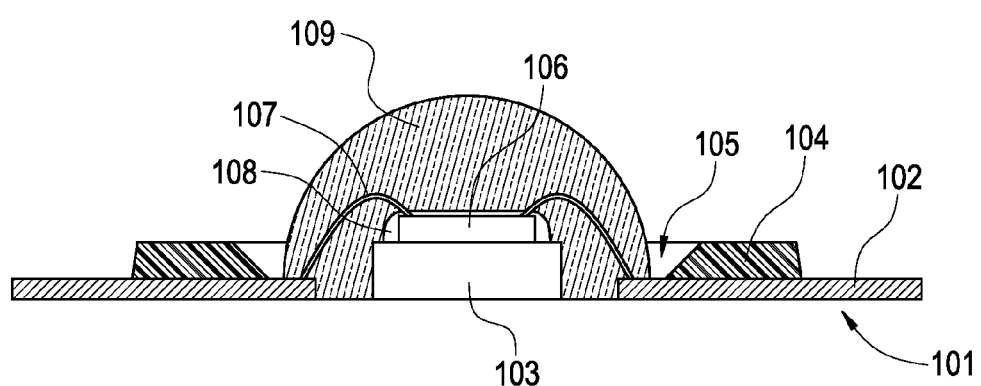
FIG. 2 is an illustration of a completely packaged LED in FIG. 1.
Figure 3:
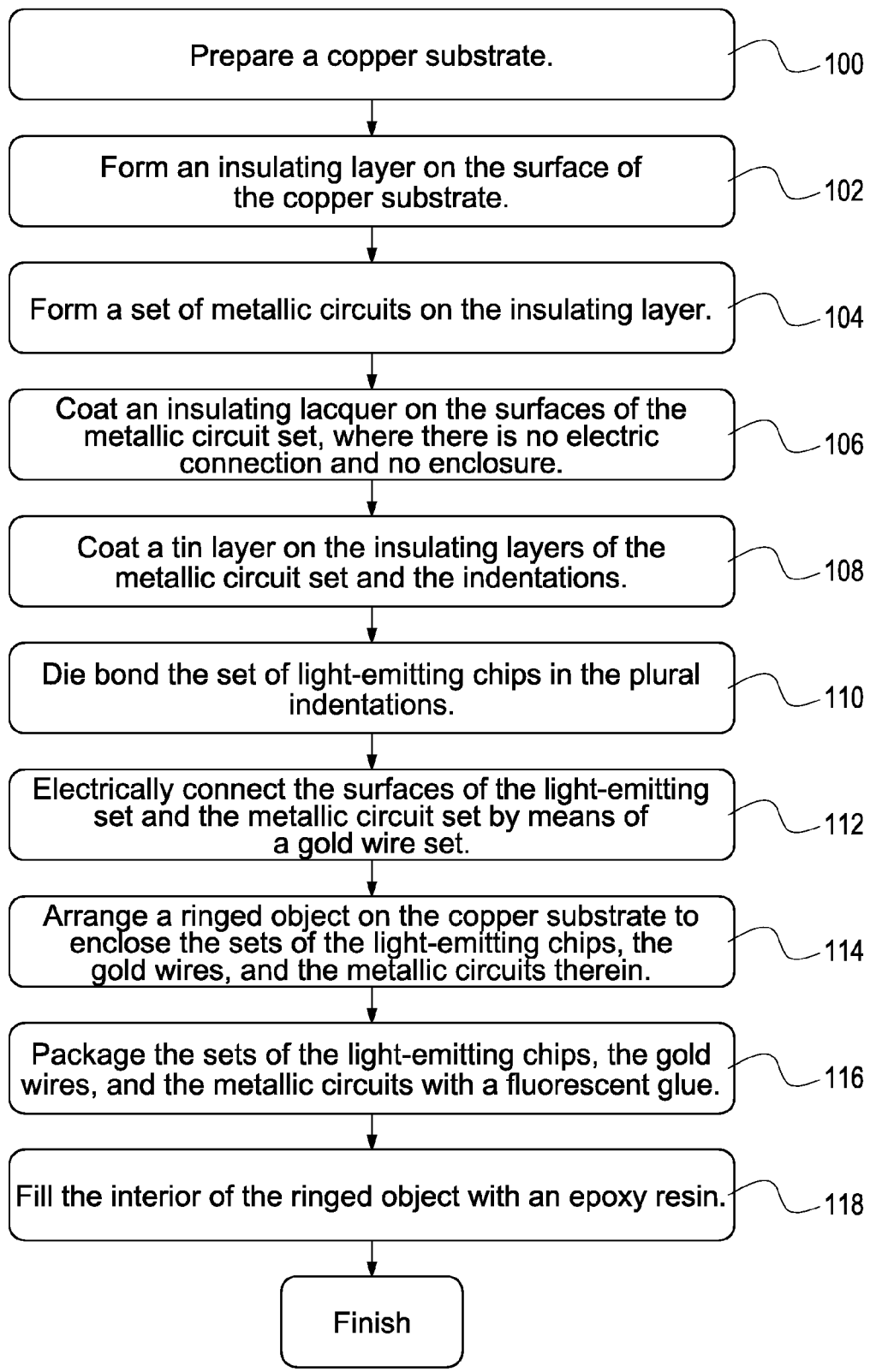
FIG. 3 is a flowchart for illustrating the manufacturing steps of an LED according to the present invention.
Figure 4:
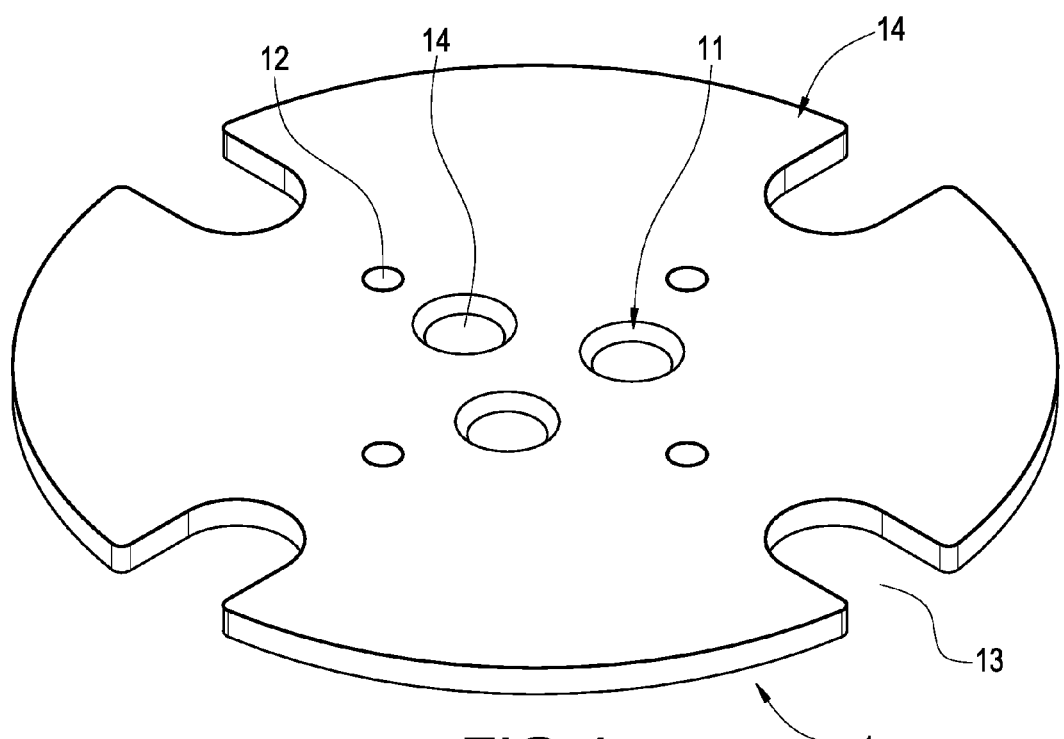
FIG. 4 is an outer appearance illustration of a substrate according to the present invention.

Please refer to FIG. 3 and FIG. 4, which respectively are a manufacturing flowchart and a substrate's outer appearance illustration of an LED according to the present invention. As shown in these figures, when an LED of the invention is packaged and manufactured, first of all, in step 100, a copper substrate 1 is provided, on which a plurality of indentations 11, positioning holes 12 and "U" shape openings 13 are arranged.

In step 102, please refer to FIG. 4 together. An insulating layer 14 having heat-conducting effect is formed on the surface of the copper substrate 1 and the bottom of the plural indentations 11.

Figure 5:
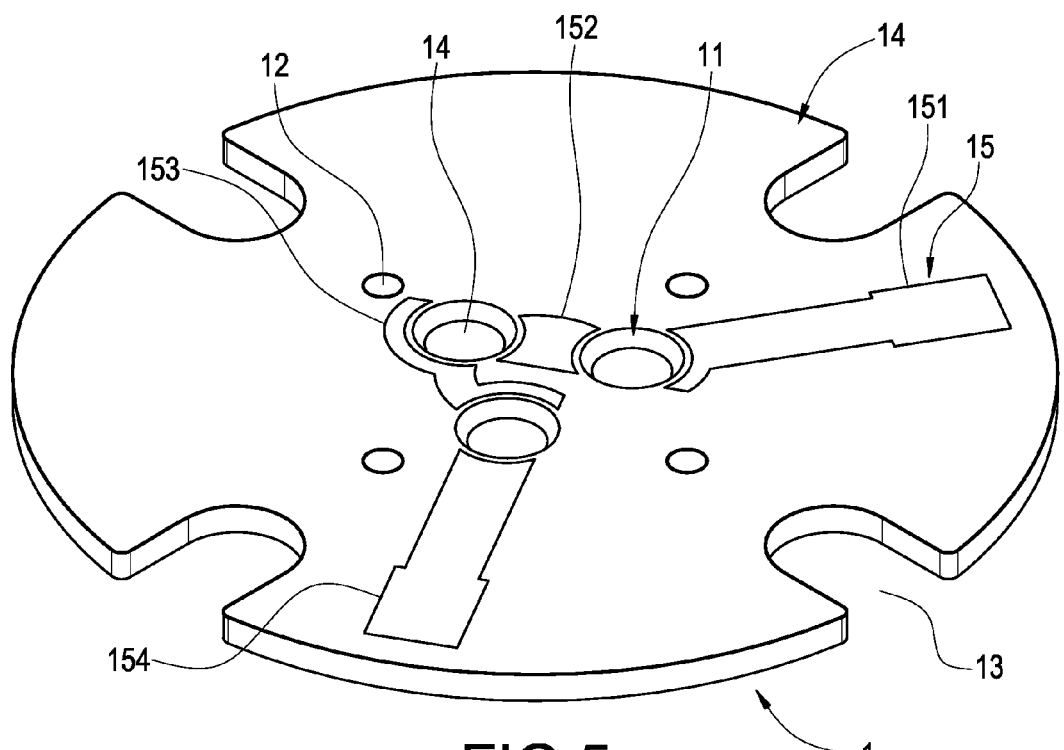
FIG. 5 is an illustration of circuits formed on the surface of a substrate according to the present invention.

In step 104, please refer to FIG. 5 together. A set of metallic circuits 15 is formed on the insulating layer 14.

Figure 6:
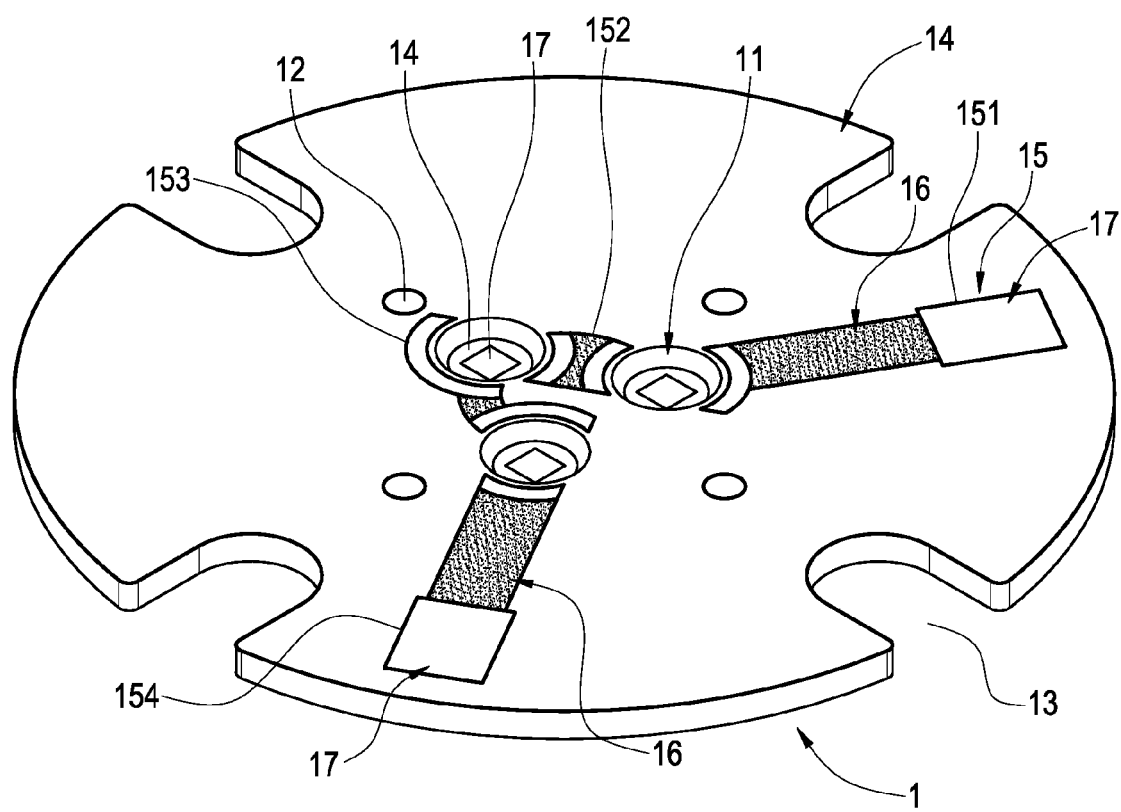
FIG. 6 is a die-bonding illustration of the circuits on the surface of a substrate according to the present invention.

In step 106, please refer to FIG. 6 together. An insulating lacquer layer 16 is coated on the surface of the metallic circuit set 15, where there is no electrical connection and without being enclosed, and the insulating lacquer layer 16 is white, so the metallic circuits 15 may be prevented from oxidation.

In step 108, please refer to FIG. 6 together. A tin layer 17 having a thickness of 4~5μ is sprayed on the surfaces of the insulating layer 14 of the indentations 11 and the surfaces of the metallic circuits 15, where there is no insulating lacquer 16 in a way, such that the thermal resistance of heat conduction is small and an excellent heat-transferring efficiency is provided.

Figure 7:
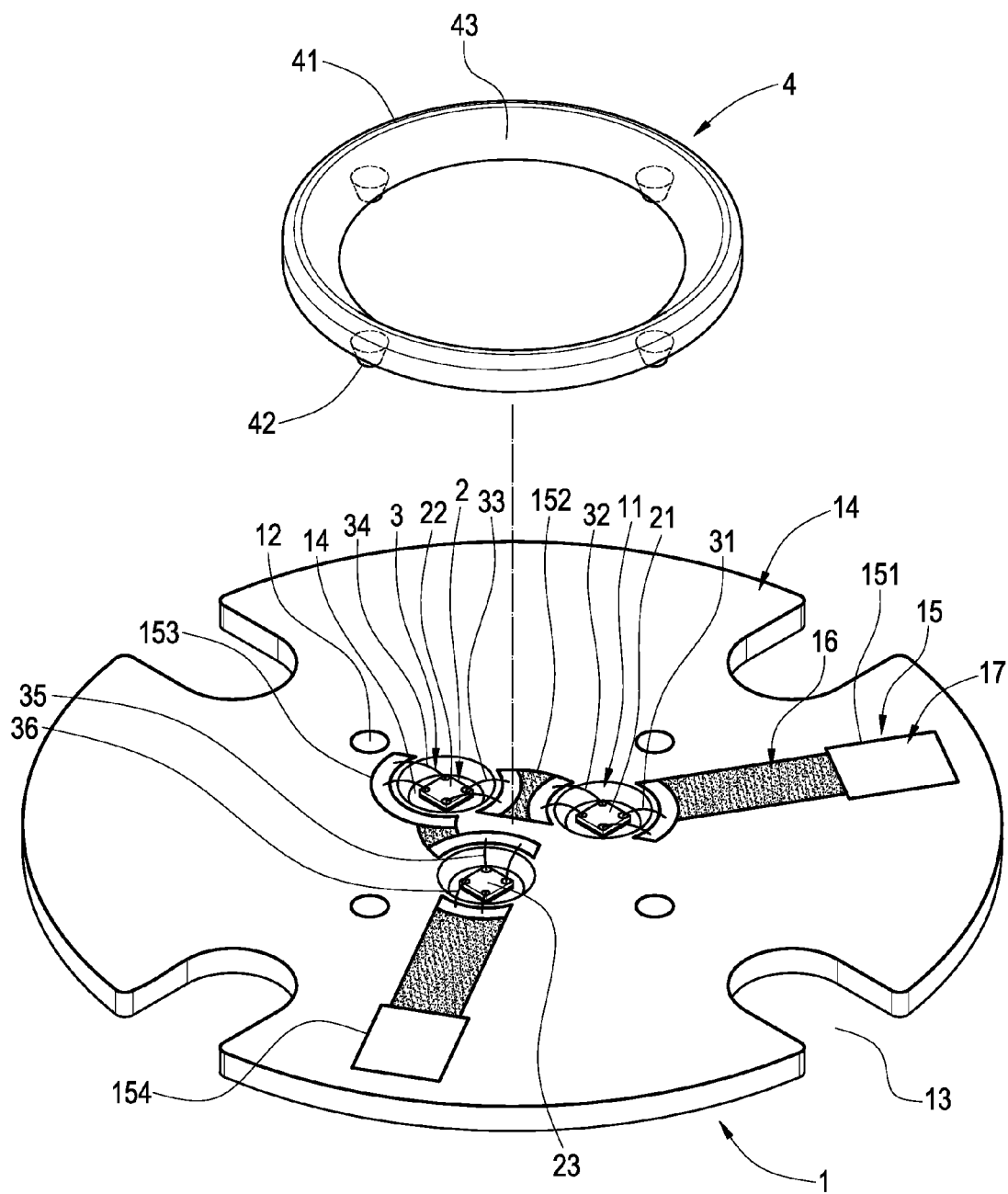
FIG. 7 is an explosive illustration of a ringed object and a substrate surface having circuits and light-emitting chips with gold wires according to the present invention.

In step 110, please refer to FIG. 7 together. A set of light-emitting chips 2 is die-bonded on the tin layers 17 of the plural indentations 11.

In step 112, please refer to FIG. 6 together. The surfaces of the light-emitting chip set 2 and the tin layers 17 on the metallic circuit set 15 are connected by a set of gold wires 3 in a way, such that a connection in series is formed among the light-emitting chips 2.

Figure 8:
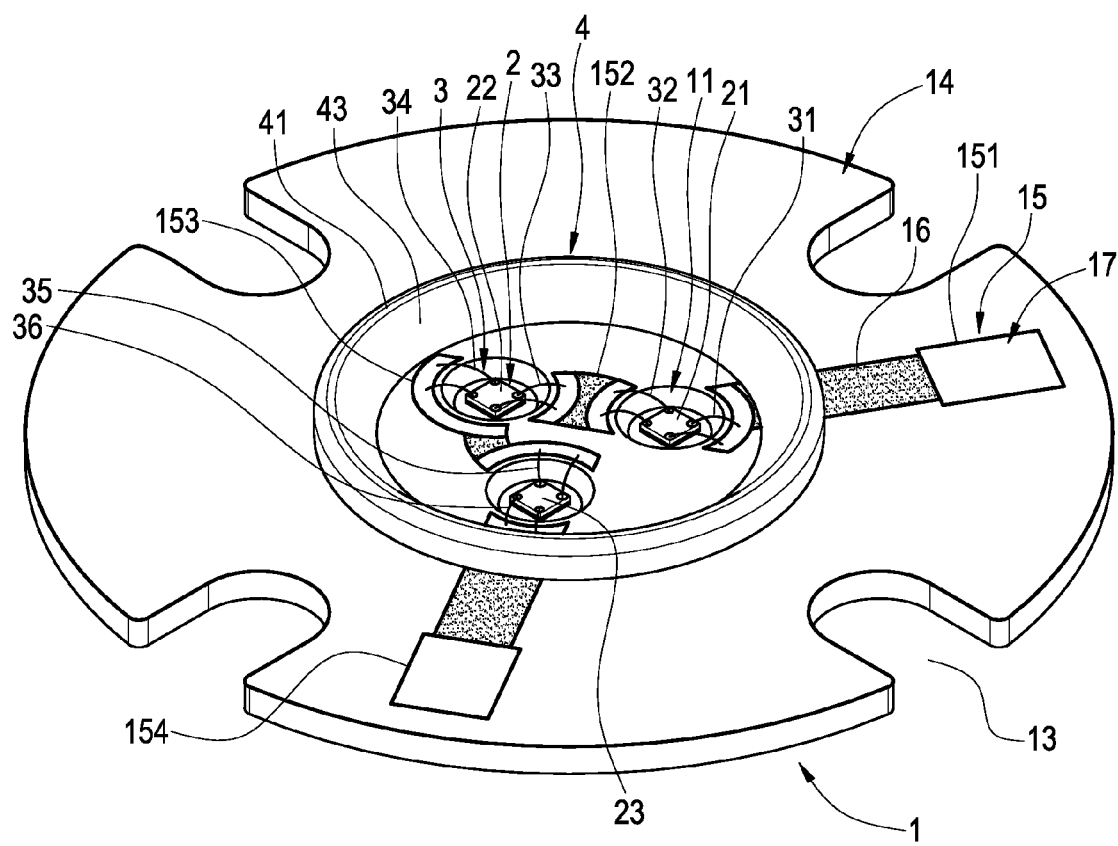
FIG. 8 is a perspective illustration of the outer appearance of a substrate surface arranged a hollow ringed object according to the present invention.
Figure 9:
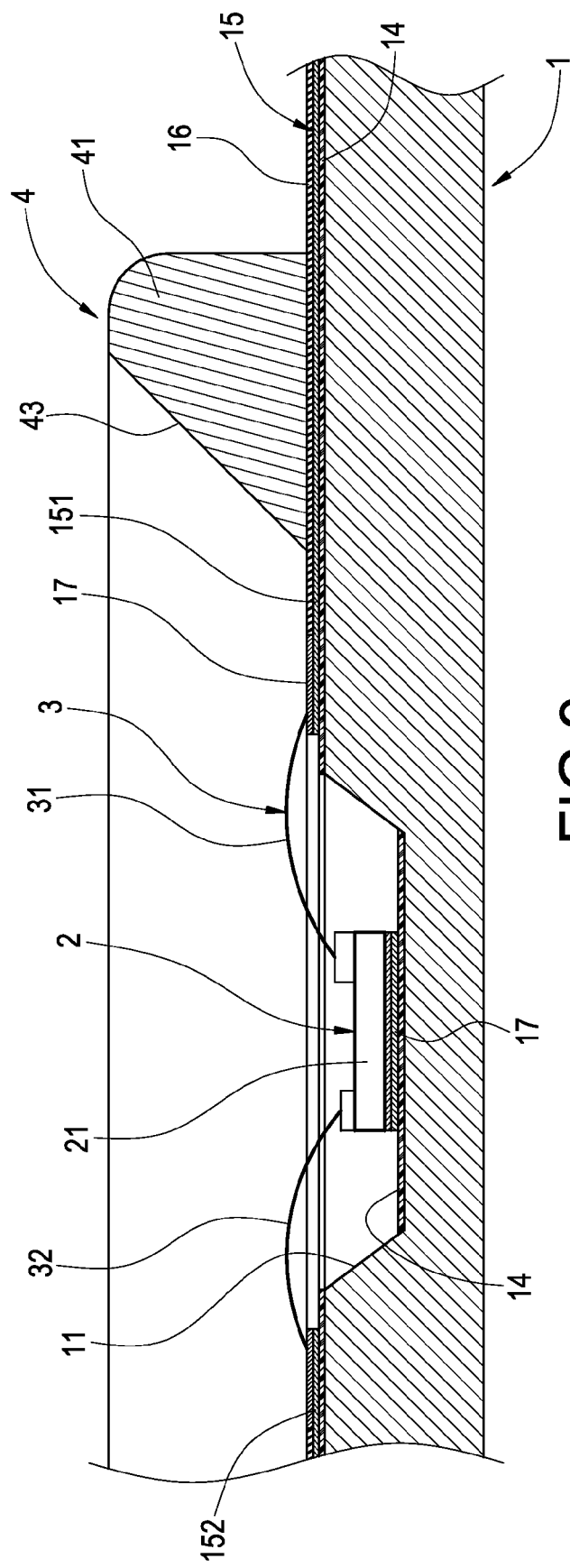
FIG. 9 is a side-sectional view of FIG. 8.

In step 114, please refer to FIGS. 7, 8, 9 together. A hollow ringed object 4 is placed on the positioning holes 12 on the surface of the copper substrate 1 and encloses the set of light-emitting chips 2, the gold wires 3, and the metallic circuits 15.

Figure 10:
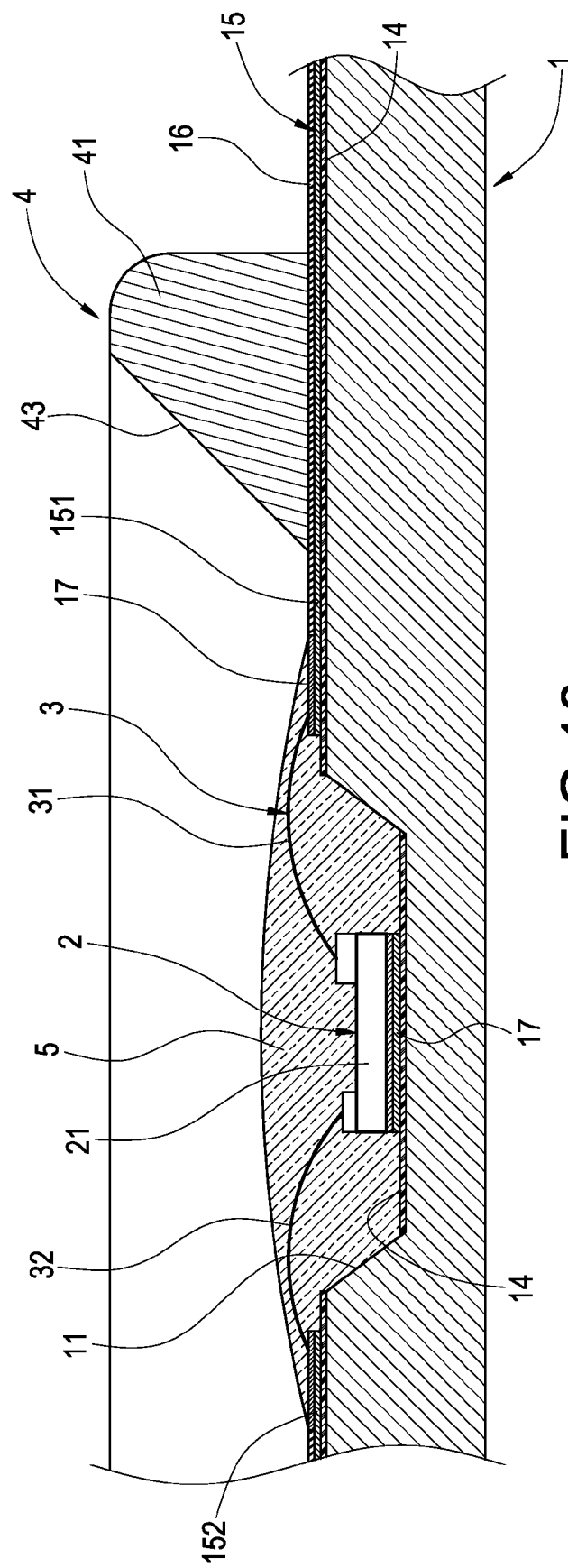
FIG. 10 is an illustration showing that fluorescent glue is attached over the structure shown in FIG. 9.

In step 116, please refer to FIG. 10 together. Some fluorescent glue is attached to the set of light-emitting chips 2, the gold wires 3, and the metallic circuits 15 within the ringed object 4, where there is no insulating lacquer 16 coated.

Figure 11:
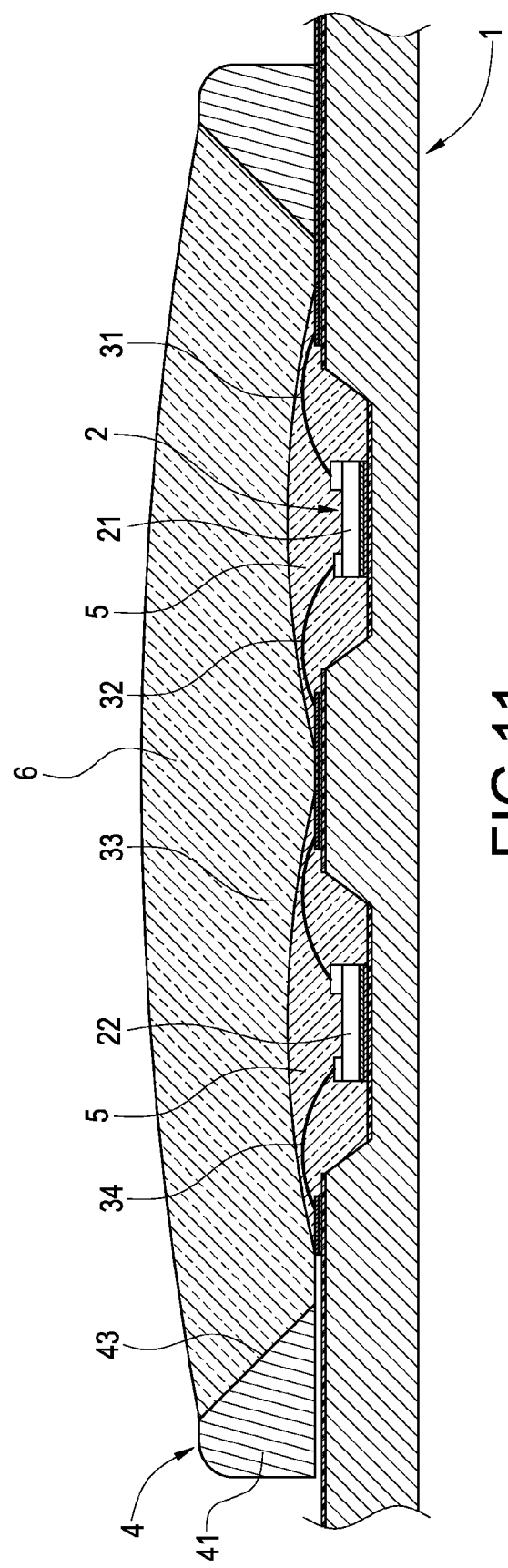
FIG. 11 is an illustration showing that an epoxy resin is attached over the structure shown in FIG. 10.

In step 118, please refer to FIG. 11 together. Some epoxy resin 6 is filled into the interior of the ringed object 4 and encloses the fluorescent layer 5. After the epoxy resin layer 6 is dry, a protecting layer is thus formed. Finally, the formation of an LED is completed by connecting a plurality of light-emitting chips in series.

Please refer to FIG. 7 and FIG. 8 again. An LED structure of the invention mainly includes: a substrate 1, a set of light-emitting chips 2, a set of gold wires 3, a ringed object 4, a fluorescent layer 5, and an epoxy layer 6.

According to a preferable embodiment of the invention, the copper substrate 1 is a circular body, on which a plurality of indentations 11 are arranged. A plurality of positioning holes 12 are arranged by surrounding the indentations 11, while a plurality of "U" shape openings 13 are arranged at the circumferential edges of the copper substrate 1. In addition, an insulating layer 14 is formed on the surface of the copper material 1 and the bottoms of the indentations 11. A set of metallic circuits 15 is arranged on the insulating layer 14 and includes: a first circuit section 151, a second circuit section 152, a third circuit section 153, and a fourth circuit section 154. A layer of insulating lacquer 16 is coated on the surfaces of the metallic circuit set 15, where there is no electrical connection and without being enclosed by the fluorescent layer 5. Furthermore, a tin layer 17 with thickness of 4~5μ is coated on the insulating surfaces 14 of the indentations 11 and the surfaces of the metallic circuits 15, where there is no insulating layer 16.

The light-emitting chip set 2 includes a first, second, third light-emitting chips 21, 22, 23, which are die-bonded on the tin layers 17 of the plural indentations 11.

The gold wire set 3 includes a first gold wire 31, a second gold wire 32, a third gold wire 33, a fourth gold wire 34, a fifth gold wire 35, and a sixth gold wire 36, in which the first circuit section 151 and the positive pole of the first light-emitting chip 21 are electrically connected by the first gold wire 31, the second circuit section 152 and the negative pole of the first light-emitting chip 21 are electrically connected by the second gold wire 32, the second circuit section 152 and the positive pole of the second light-emitting chip 22 are electrically connected by the third gold wire 33, the third circuit section 153 and the negative pole of the second light-emitting chip 22 are electrically connected by the fourth gold wire 34, the third circuit section 153 and the positive pole of the third light-emitting chip 23 are electrically connected by the fifth gold wire 35, finally, the fourth circuit section 154 and the negative pole of the third light-emitting chip 23 are electrically connected by the sixth gold wire 36. Thereby, the first, second, third light-emitting chips 21, 22, 23 are electrically connected in series.

Please refer to FIG. 9. In this case, the ringed object 4 is a hollow ring body 41 made of metallic or plastic materials. A positioning part 42 is projected from the bottom of the ring body 41 and is positioned to the positioning holes 12. In addition, the inner wall of the ring body 41 is inclined to form a reflecting face 43, which is capable of focusing the light beams generated from the light-emitting chips 2 and reflecting and projecting them outwardly.

Please refer to FIG. 10. In this case, the fluorescent layer 5 is made of material of fluorescent glue, which encloses the surface of a set of the light-emitting chip 2, the gold wires 3, and the metallic circuits 15, where there is no insulating lacquer 16 coated, thus a fluorescent layer 5 being formed.

Please refer to FIG. 11. In this case, the epoxy resin layer 6 is made of epoxy resin and packages the fluorescent layers 5 within the ring body 31 in a way, such that an epoxy resin layer 6 capable of protecting the fluorescent layer 5 and sets of the light-emitting chips 2, the gold wires 3, and the metallic circuits 15 is formed.

When the LED structure is used, a positive power source is connected to the first circuit section 151, while a negative power source is connected to the fourth circuit section 154, so the first, the second, and the third light-emitting chips 21, 22, 23 are lighted. The light beams will be focused and projected outwardly, since the first, the second, and the third light-emitting chips 21, 22, 23 are die-bonded to the bottoms of the indentations 11 via the tin layer 17 of a thickness of 4~5μ.

Because the thickness is only 4~5μ, its thermal resistance is less than that of a silver glue commonly used. Furthermore, when heat is conducted downwardly, since the thermal resistance of the copper substrate 1 is less than those of sapphire and alumina if they are used as a supporting substrate, so the heat sources generated from the first, the second, and the third light-emitting chips 21, 22, 23 can be transferred to the copper substrate 1 rapidly for processing a cooling procedure. Under such arrangement, the using life of the light-emitting chip 2 can thereby be prolonged.

Figure 12:
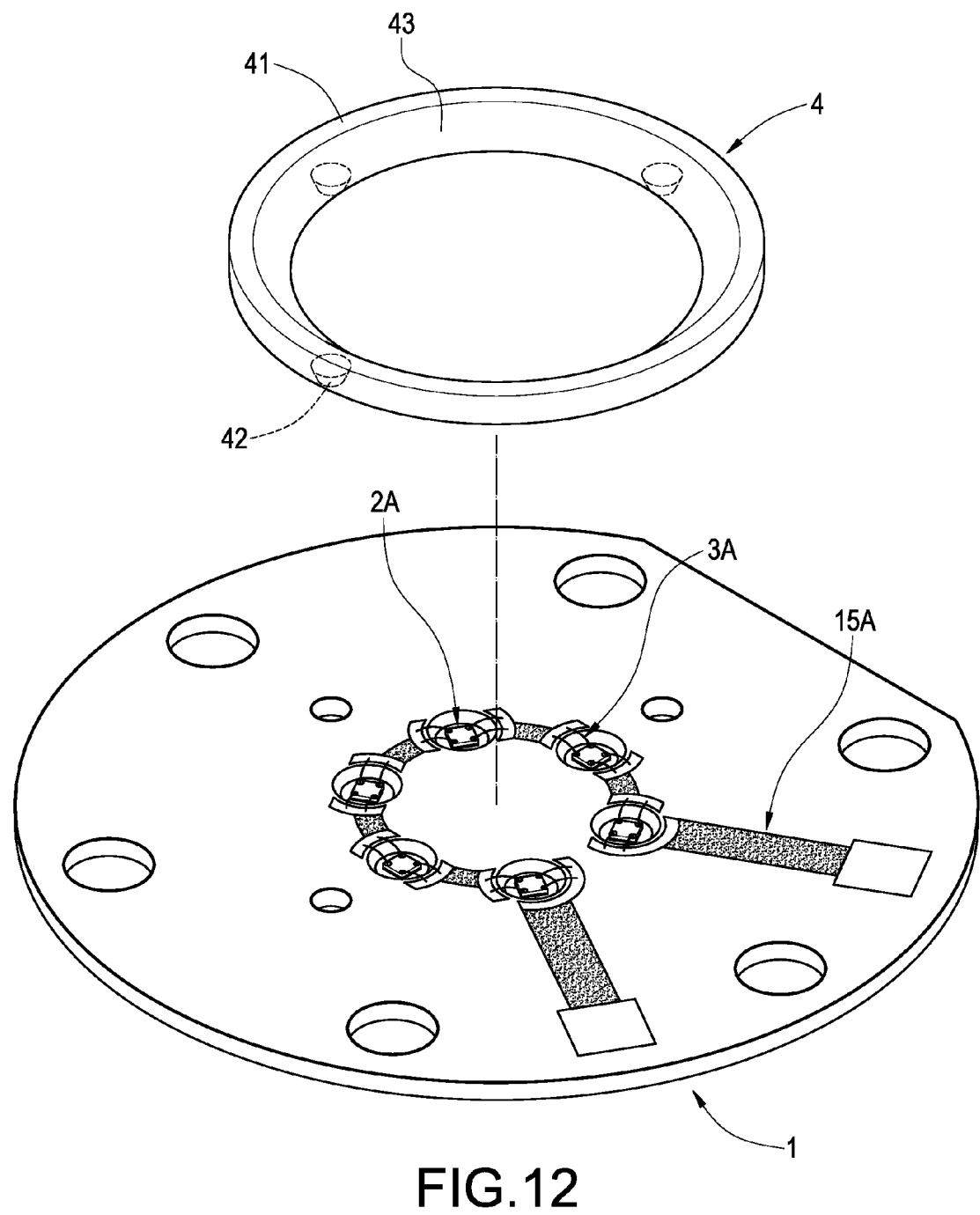
FIG. 12 is a perspective view explosively illustrating another preferable embodiment of an LED according to the present invention; and, FIG. 13 is a top view illustrating an assembly of another preferable embodiment of an LED according to the present invention.
Figure 13:
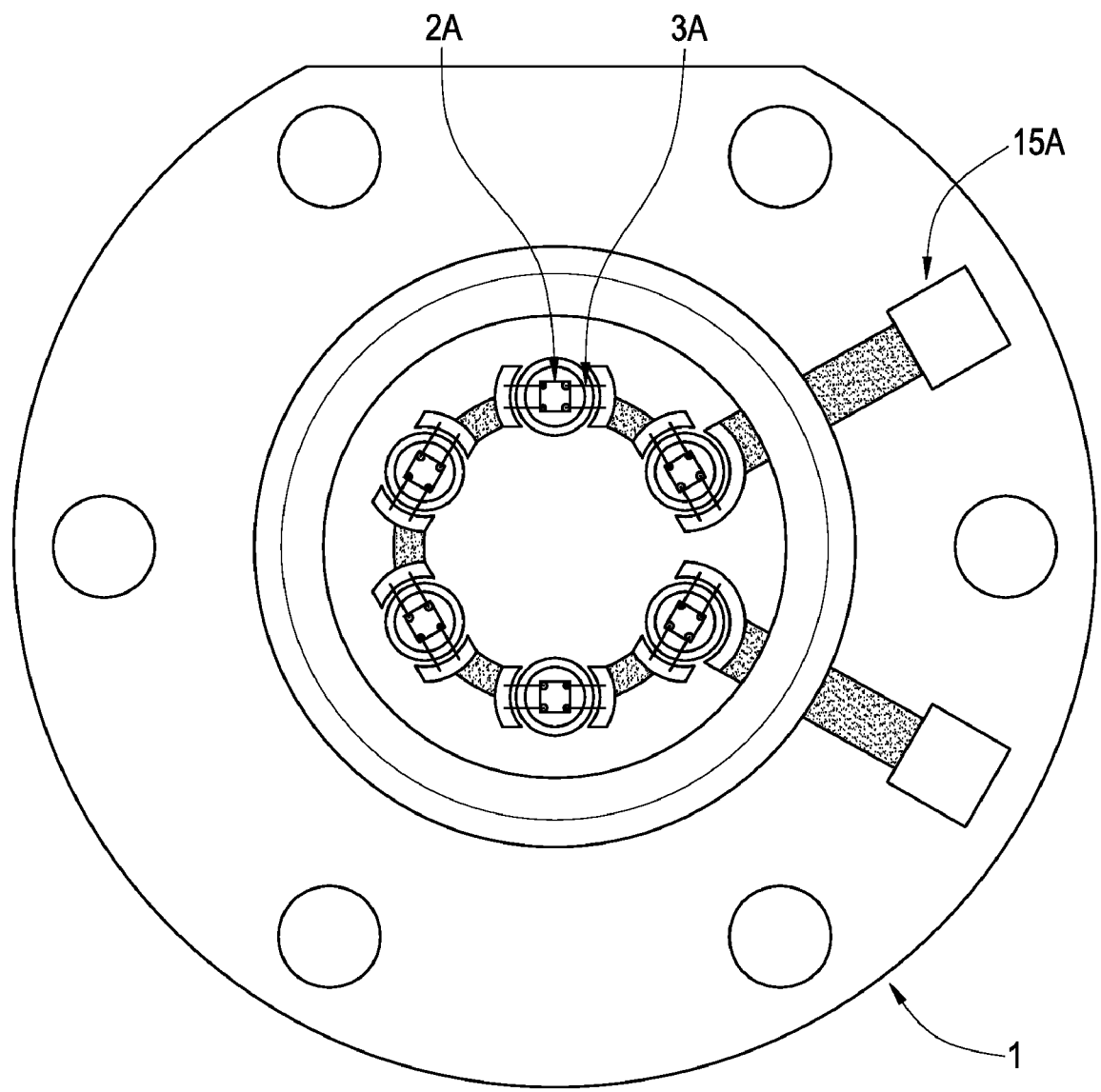

Please refer to FIG. 12 and FIG. 13, which respectively are a perspective explosive view and an assembled top view of another preferable embodiment of an LED according to the present invention. As shown in these figures, the structure of this embodiment is roughly same as that of above embodiment described in FIG. 4 through FIG. 11. The only difference is that there are more light-emitting chips 2A, which are electrically connected in a circular series by means of gold wire sets 3A and metallic circuits 15A. In this case, the light beams projected outwardly will be brighter.

Summarizing aforementioned description, the invention is a novel structure for LED indeed, which may positively reach the expected usage objective for solving the drawbacks of the prior arts, and which extremely possesses the innovation and progressiveness to completely fulfill the applying merits of new type patent, according to which the invention is thereby applied. Please examine the application carefully and grant it as a formal patent for protecting the rights of the inventor.

However, the aforementioned description is only a number of preferable embodiments according to the present invention, being not used to limit the patent scope of the invention, so equivalently structural variation made to the contents of the present invention, for example, description and drawings, is all covered by the claims claimed thereinafter.

What is claimed is:

1. A packaging method of LED of high cooling efficiency, including following steps in sequence of:
    a) preparing a copper substrate, on which a plurality of indentations are formed;
    b) coating an insulating layer on a surface of the copper substrate and on bottoms of the indentations;
    c) coating a set of metallic circuits on the insulating layer;
    d) coating an insulating lacquer on the surfaces of the set of metallic circuits, where there is no electric connection and no enclosure;
    e) coating a plurality of tin layers on a surface of the insulating layer of the indentations and on the surfaces of the set of metallic circuits, where there is no coating of the insulating lacquer;
    f) die bonding a set of light-emitting chips on the tin layers of the indentations;
    g) electrically connecting the set of light-emitting chips to the set of metallic circuits by means of a plurality of gold wires, making the set of the light-emitting chips electrically connected in series;
    h) forming a hollow ringed object on a surface of the copper substrate, the ringed object enclosing the set of light-emitting chips, the gold wires, and the set of metallic circuits therein;
    i) attaching a fluorescent glue to each of the surfaces of the tin layers of the set of light-emitting chips, the gold wires, and the set of metallic circuits, for forming a plurality of fluorescent layers; and
    j) filling an epoxy resin into an interior of the ringed object to enclose the fluorescent layers for forming an epoxy resin layer.

2. The packaging method of LED of high cooling efficiency according to claim 1, wherein the copper substrate in step a) is a circular body, on which a plurality of positioning holes are arranged to surround the indentations, and at a circumferential edge of which a plurality of "U" shape openings are arranged.

3. The packaging method of LED of high cooling efficiency according to claim 1, wherein the set of metallic circuits in step c) is comprised of a plurality of circuit sections.

4. The packaging method of LED of high cooling efficiency according to claim 1, wherein the insulating lacquer in step d) is white.

5. The packaging method of LED of high cooling efficiency according to claim 1, wherein the thickness of one of the tin layers in step e) is about 4~5μ.

6. The packaging method of LED of high cooling efficiency according to claim 1, wherein the set of light-emitting chips in step f) is comprised of a plurality of light-emitting chips.

7. The packaging method of LED of high cooling efficiency according to claim 1, wherein the ringed object in step h) is made from one material of metal or plastic.

8. The packaging method of LED of high cooling efficiency according to claim 7, wherein the ringed object has a ring body, a bottom of which has a positioning part, and an inner wall of which is inclined for forming a reflecting face.

9. The packaging method of LED of high cooling efficiency according to claim 1, wherein each of the fluorescent layers in step i) is made by a fluorescent glue.

10. The packaging method of LED of high cooling efficiency according to claim 1, wherein the step j) is to fill an epoxy resin into an interior of the ringed object for forming an epoxy resin layer.

* * * * *